(12) United States Patent
Yang et al.

(10) Patent No.: US 11,538,677 B2
(45) Date of Patent: Dec. 27, 2022

(54) SYSTEMS AND METHODS FOR DEPOSITING HIGH DENSITY AND HIGH TENSILE STRESS FILMS

(71) Applicant: Applied Materials, Inc., Santa Clara, CA (US)

(72) Inventors: Chuanxi Yang, Los Altos, CA (US); Hang Yu, San Jose, CA (US); Yu Yang, Cupertino, CA (US); Chuan Ying Wang, Sunnyvale, CA (US); Allison Yau, Mountain View, CA (US); Xinhai Han, Santa Clara, CA (US); Sanjay G. Kamath, Fremont, CA (US); Deenesh Padhi, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 163 days.

(21) Appl. No.: 17/009,002

(22) Filed: Sep. 1, 2020

(65) Prior Publication Data

US 2022/0068630 A1    Mar. 3, 2022

(51) Int. Cl.
*H01L 21/02* (2006.01)
*C23C 16/34* (2006.01)

(52) U.S. Cl.
CPC ........ *H01L 21/0217* (2013.01); *C23C 16/345* (2013.01); *H01L 21/02274* (2013.01)

(58) Field of Classification Search
None
See application file for complete search history.

(56) References Cited

U.S. PATENT DOCUMENTS

| | | |
|---|---|---|
| 7,657,143 B2 | 2/2010 | Kharas |
| 2008/0020591 A1 | 1/2008 | Balseanu et al. |
| 2009/0311857 A1 | 12/2009 | Todd et al. |
| 2014/0273530 A1* | 9/2014 | Nguyen ............. H01L 21/0228 438/792 |

FOREIGN PATENT DOCUMENTS

| | | |
|---|---|---|
| JP | 2008-517479 A | 5/2008 |
| KR | 2014-0012901 A | 2/2014 |
| TW | 200710954 A | 3/2007 |
| TW | 202025212 A | 7/2020 |

OTHER PUBLICATIONS

International Search Report and Written Opinion dated Dec. 23, 2021 in International Patent Application No. PCT/US2021/047650, 9 pages.

* cited by examiner

*Primary Examiner* — Asok K Sarkar
(74) *Attorney, Agent, or Firm* — Kilpatrick Townsend & Stockton LLP (57) ABSTRACT

Exemplary methods of semiconductor processing may include flowing a silicon-containing precursor, a nitrogen-containing precursor, and diatomic hydrogen into a processing region of a semiconductor processing chamber. A substrate may be housed within the processing region of the semiconductor processing chamber. The methods may also include forming a plasma of the silicon-containing precursor, the nitrogen-containing precursor, and the diatomic hydrogen. The plasma may be formed at a frequency above 15 MHz. The methods may also include depositing a silicon nitride material on the substrate.

20 Claims, 6 Drawing Sheets

SYSTEMS AND METHODS FOR DEPOSITING HIGH DENSITY AND HIGH TENSILE STRESS FILMS

TECHNICAL FIELD

The present technology relates to deposition processes and chambers. More specifically, the present technology relates to methods of producing high density and high tensile stress films at low temperatures.

BACKGROUND

Integrated circuits are made possible by processes that produce intricately patterned material layers on substrate surfaces. Producing patterned material on a substrate requires controlled methods for forming and removing material. Plasma-enhanced deposition may produce films having certain characteristics, which may affect the performance of the device. The characteristics of the film may be adjusted or enhanced by modifying the deposition conditions, such as the chemistry and frequency of the plasma.

Thus, there is a need for improved systems and methods that can be used to produce high quality devices and structures. These and other needs are addressed by the present technology.

SUMMARY

Exemplary methods of semiconductor processing may include flowing a silicon-containing precursor, a nitrogen-containing precursor, and diatomic hydrogen into a processing region of a semiconductor processing chamber. A substrate may be housed within the processing region of the semiconductor processing chamber. The methods may also include forming a plasma of the silicon-containing precursor, the nitrogen-containing precursor, and the diatomic hydrogen. The plasma may be formed at a frequency above 15 MHz. The methods may also include depositing a silicon nitride material on the substrate.

In some embodiments, the silicon nitride material may be characterized by a density above or about 2.85 g/cm$^3$. The silicon nitride material may be characterized by a stress above or about 400 MPa. The silicon nitride material may be characterized by a refractive index above or about 1.75. The silicon nitride material may include less than or about 10% of hydrogen.

Greater than or about 100 sccm of the diatomic hydrogen may be flowed into the processing region of the semiconductor processing chamber. Less than or about 5000 sccm of the diatomic hydrogen may be flowed into the processing region of the semiconductor processing chamber.

The plasma may be formed at a temperature below or about 550° C. The frequency may be above or about 27 MHz.

Some embodiments may encompass methods including flowing a silicon-containing precursor, a nitrogen-containing precursor, and diatomic hydrogen into a processing region of a semiconductor processing chamber. A substrate may be housed within the processing region of the semiconductor processing chamber. The methods may also include forming a plasma of the silicon-containing precursor, the nitrogen-containing precursor, and the diatomic hydrogen, wherein the plasma is free of any material having a nitrogen-hydrogen bond. Further, the methods may include depositing a silicon nitride material on the substrate. The silicon nitride material may characterized by a density above or about 2.85 g/cm$^3$, and the silicon nitride material may be characterized by a stress above or about 400 MPa.

In some embodiments, the silicon nitride material may be characterized by a refractive index above or about 1.75. The silicon nitride material may include less than or about 10% of hydrogen.

Greater than or about 100 sccm of the diatomic hydrogen may be flowed into the processing region of the semiconductor processing chamber. Less than or about 5000 sccm of the diatomic hydrogen may be flowed into the processing region of the semiconductor processing chamber.

The plasma may be formed at a temperature below or about 550° C. The plasma may be formed at a frequency above 15 MHz. The frequency may be above or about 27 MHz.

Some embodiments of the present technology may encompass methods of flowing a silicon-containing precursor, a nitrogen-containing precursor, and diatomic hydrogen into a processing region of a semiconductor processing chamber. A substrate may be housed within the processing region of the semiconductor processing chamber. The methods may also include forming a plasma of the silicon-containing precursor, the nitrogen-containing precursor, and the diatomic hydrogen. Further, the methods may include depositing a silicon nitride material on the substrate. Greater than or about 100 sccm of the diatomic hydrogen may be flowed into the processing region of the semiconductor processing chamber, and less than or about 5000 sccm of the diatomic hydrogen may be flowed into the processing region of the semiconductor processing chamber.

In some embodiments, the silicon nitride material may be characterized by a density above or about 2.85 g/cm$^3$. The silicon nitride material may be characterized by a stress above or about 400 MPa.

Such technology may provide numerous benefits over conventional systems and techniques. For example, including diatomic hydrogen with silicon-containing and nitrogen precursors during high-frequency plasma deposition may provide a silicon nitride film having improved characteristics. For example, both the density and the stress of the silicon nitride film may be increased. Further, the incorporation of hydrogen in the silicon nitride film may be reduced. In addition, the silicon nitride film may be formed at low temperatures, thereby reducing the thermal budget and preventing damage to other layers. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, in memory development, such as DRAM, deposition of films may be performed to produce the cell structures. In order to reduce the thermal budget and prevent damage to materials that have already been deposited, it is desirable to use a low-temperature deposition process. For example, the temperature during deposition of the film may be less than or about 550° C., less than or about 450° C., or even less.

A silicon nitride film may be used as a hardmask, in which case a high density, a high tensile stress, and a high quality may improve processing for certain structures being produced. A high density film may be more resistant to more etching chemistries, and may have higher etch selectivity relative to materials above or below the film to form various patterns. Because the silicon nitride film may often be formed on a wafer characterized by a compressive stress due to features of the structure and materials used in the formation, a silicon nitride film characterized by a tensile stress may produce a more neutral stress or a flat curvature, which can prevent breakage, delamination, or other processing effects. However, many conventional low-temperature deposition processes have a trade-off between density and stress for silicon nitride films, such that it is not possible to achieve both a high density and a high tensile stress. For example, low-temperature physical vapor deposition (PVD) processes can achieve density of 3 g/cm$^3$, but the resulting stress may be more compressive due to the strong ion bombardment produced by the sputtering process. Adjustments to the PVD processes to increase the stress, such as by altering the precursor distribution or power, may result in a decrease in the density. Further, conventional low-temperature plasma-enhanced chemical vapor deposition (PECVD) processes that use $SiH_4$ and $NH_3$ as reactive precursors and that typically use a plasma frequency of 13.56 MHz are unable to produce silicon nitride films that are characterized by both higher density and higher stress. This may be at least partially because these films have a high in-film hydrogen content above 10%, which may reduce the film quality due to void formation that can occur from subsequent outgassing. Hydrogen incorporation may also reduce film stress by reducing the more tetrahedral network formed when hydrogen incorporation is reduced. Dissociated ammonia may include nitrogen-and-hydrogen bonded radicals, which may be more likely to be incorporated within a film, and may further increase hydrogen incorporation. Moreover, N—H bonds within a deposited film may detrimentally reduce both density and film stress.

The present technology may overcome these issues by performing a deposition process utilizing high-frequency plasma that is formed by gas mixtures of $SiH_4$, $N_2$, and $H_2$. Some conventional PECVD processes use $N_2$ instead of $NH_3$ as the nitrogen source to form a silicon nitride film. Because the $N_2$ has a high electron-impact dissociation of 24.3 eV, the $N_2$ dissociation in the plasma is weak, such that the $N_2$ might not be fully dissociated in a 13.56 MHz plasma. Therefore, the resulting silicon nitride film tends to have a high hydrogen content because it is difficult to break the bond between the two nitrogen atoms to form the silicon-nitrogen bond. At a higher plasma frequency, the $N_2$ dissociation process could become more efficient. However, there is still a high hydrogen content in the film because the silicon-hydrogen bond in $SiH_4$ cannot be completely removed. Accordingly, the present technology may increase the frequency to dissociate the $N_2$, and may also include $H_2$ gas as a precursor for the plasma, which may beneficially create a chemical annealing atmosphere that promotes the desorption of the nitrogen-hydrogen bond. As discussed in further detail below, although a goal may be to reduce hydrogen incorporation within the film, counterintuitively incorporating the $H_2$ gas with the deposition precursors may decrease the number of nitrogen-hydrogen bonds that are formed in the silicon nitride film, increase the density of the film, and increase the stress of the film as compared with conventional low-temperature deposition technologies. Incorporating the $H_2$ gas may also decrease the in-film hydrogen content and increase the film quality. When the nitrogen-hydrogen bonds within the film are reduced by the incorporation of hydrogen in the plasma precursors, the more volatile hydrogen residuals may be withdrawn from the film during deposition and exhausted from the processing chamber.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may be used to perform deposition processes according to embodiments of the present technology before additional details according to embodiments of the present technology are described.

Figure 1:
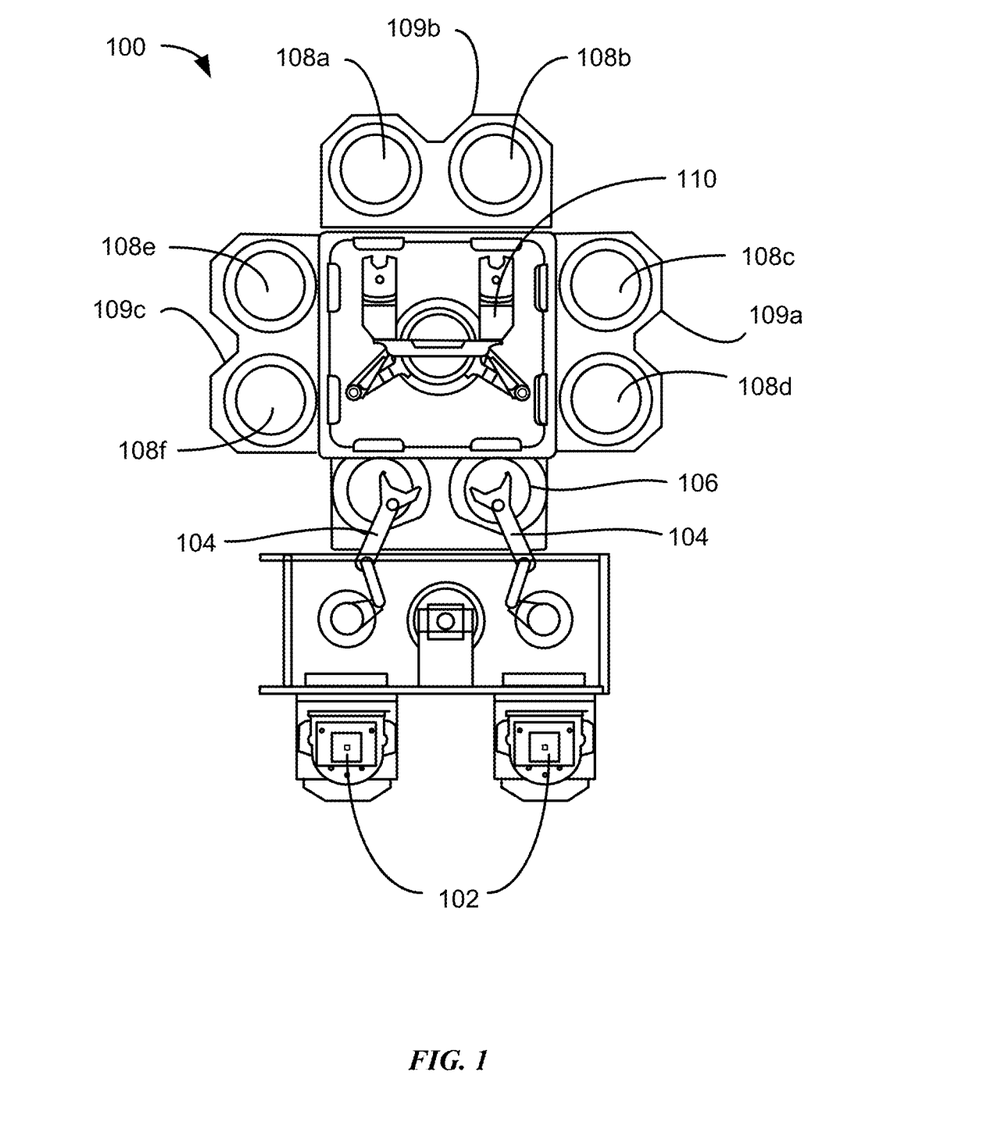
FIG. 1 shows a top plan view of an exemplary processing system according to some embodiments of the present technology.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
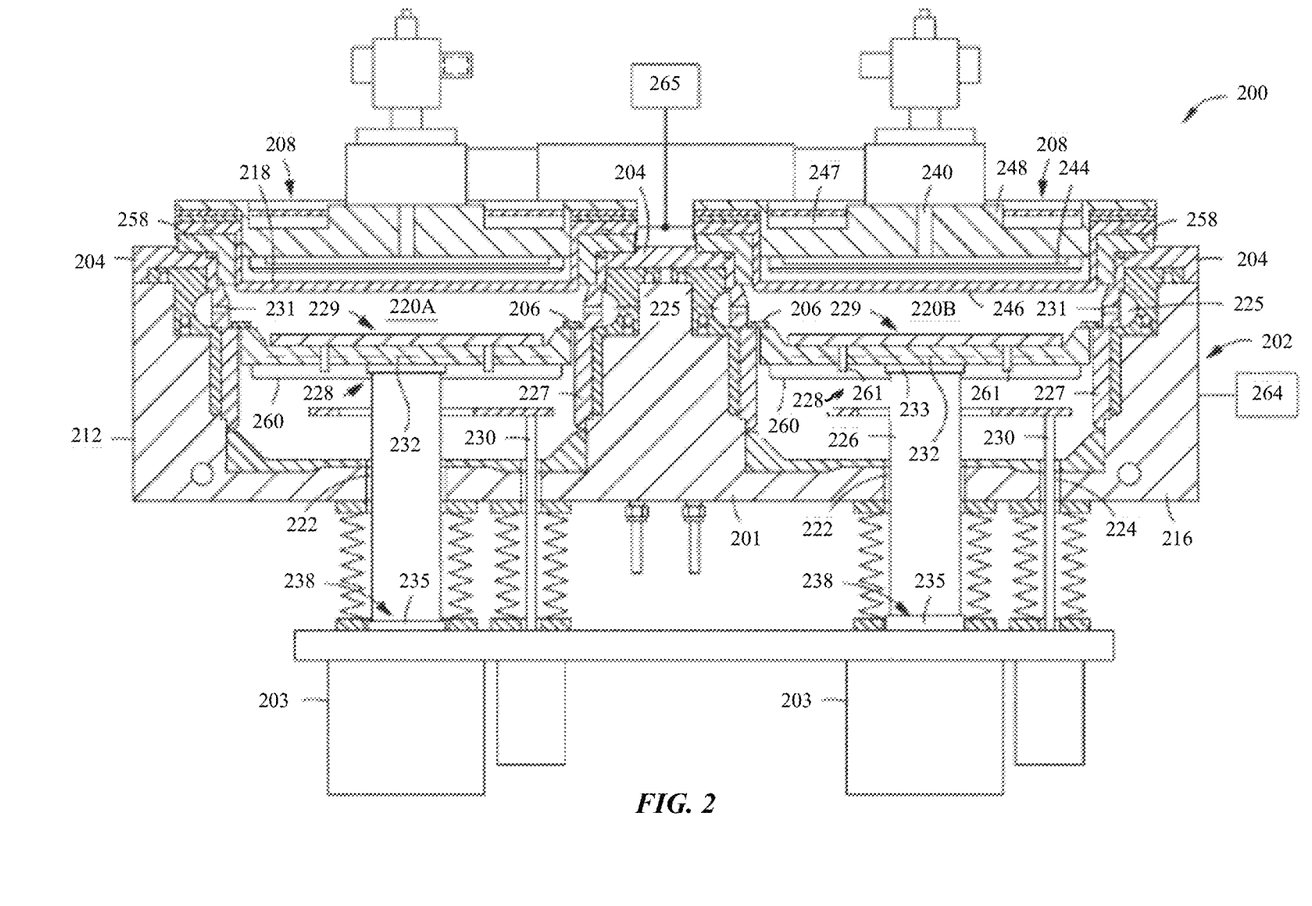
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include lid stack components according to embodiments of the present technology, and as may be explained further below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228. The dual-channel showerhead 218 may have a spacing greater than or about 200 mils, greater than or about 300 mils, greater than or about 400 mils, greater than or about 500 mils, greater than or about 600 mils, or greater. Alternatively or in addition, the dual-channel showerhead 218 may have a spacing less than or about 1200 mils, less than or about 1100 mils, less than or about 1000 mils, less than or about 900 mils, less than or about 800 mils, less than or about 700 mils, or less.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
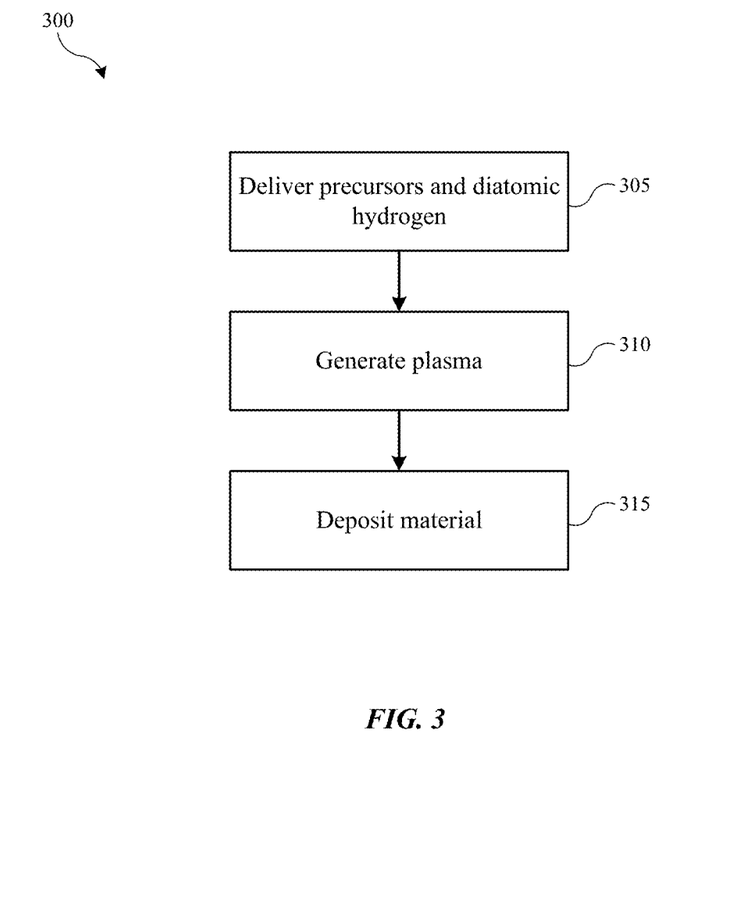
FIG. 3 shows operations of an exemplary method of semiconductor processing according to some embodiments of the present technology.

FIG. 3 shows operations of an exemplary method 300 of semiconductor processing according to some embodiments of the present technology. The method may be performed in a variety of processing chambers, including processing system 200 described above, as well as any other chamber in which plasma deposition may be performed. Method 300 may include a number of optional operations, which may or may not be specifically associated with some embodiments of methods according to the present technology. Method 300 may be used to deposit a silicon nitride film on a substrate, such as substrate 229.

Method 300 may include a processing method that may include operations for forming a material film or other deposition operations at high frequency, such as producing DRAM memory or other materials, which may be formed to have a higher density and/or a higher stress relative to conventional processes. The method may include optional operations prior to initiation of method 300, or the method may include additional operations. For example, method 300 may include operations performed prior to the start of the method, including additional deposition, removal, or treatment operations. In some embodiments, method 300 may include flowing a plurality of precursors into a processing chamber at operation 305, which may deliver the precursors into a processing region of the chamber where a substrate may be housed, such as region 220, for example. The precursors may be delivered with diatomic hydrogen gas. Further, carrier gases such as argon and/or helium may be used to deliver the precursors.

In some embodiments, the precursors may include a silicon-containing precursor, such as silane, and a nitrogen-containing precursor, such as diatomic nitrogen. Although any silicon-containing precursor may be used in embodiments of the present technology, by utilizing silane the amount of hydrogen within the processing region may be better controlled, and hydrogen incorporation within the deposited film may be reduced. The precursors may or may not include additional precursors, such as carrier gases and/or one or more oxygen-containing precursors for depositing an oxide layer. The precursors may also include hydrogen gas. As discussed in further detail below, including the diatomic hydrogen gas with the precursors may decrease the number of nitrogen-hydrogen bonds that are formed in the silicon nitride film, increase the density of the film, and increase the stress of the film as compared with conventional low-temperature deposition technologies. Additionally, in some embodiments the processing precursors may expressly exclude any precursors including a nitrogen-hydrogen bond, which may impact the film characteristics as previously described. Consequently, in some embodiments the gas phase materials may be free of any nitrogen-hydrogen bonds.

At operation 310, a plasma may be generated of the precursors and the diatomic hydrogen within the processing region, such as by providing RF power to the faceplate to generate a plasma within processing region 220, although any other processing chamber capable of producing plasma may similarly be used. The plasma may be generated at any of the frequencies previously described, and may be generated at a frequency of greater than or about 15 MHz, greater than or about 20 MHz, greater than or about 27 MHz, greater than or about 40 MHz, or greater. Alternatively or in addition, the plasma may be generated at a frequency of less than or about 100 MHz, less than or about 80 MHz, less than or about 60 MHz, or less. By utilizing a higher frequency plasma, the dissociation of the nitrogen may be increased, and the throughput may be increased due to increased deposition rates.

Material formed in the plasma may be deposited on the substrate at operation 315, which may produce a silicon-and-nitrogen-containing material, such as silicon nitride. The deposition may be performed at substrate or pedestal temperatures less than or about 550° C., less than or about 500° C., less than or about 450° C., less than or about 400° C., or less. By utilizing a lower temperature, the thermal budget for the DRAM memory may not be exceeded, and damage to materials that have already been deposited on the substrate may be prevented. Further, the deposition may be performed at a power greater than or about 25 W, greater than or about 250 W, greater than or about 500 W, greater than or about 750 W, greater than or about 1000 W, greater than or about 1250 W, or greater. By utilizing a higher power, the deposition rate may be increased, which indicates that the dissociation of the nitrogen may be a limiting factor in the process. However, as plasma power is increased, nitrogen dissociation may further increase, and additional nitrogen radicals may be incorporated within the film, which can reduce silicon-nitrogen network formation as will be discussed below. Accordingly, in some embodiments the plasma power may be maintained below or about 3000 W, below or about 2500 W, below or about 2000 W, below or about 1500 W, below or about 1250 W, below or about 1000 W, below or about 900 W, or less. In addition, the pressure may be maintained at greater than or about 2 Torr, greater than or about 3 Torr, greater than or about 4 Torr, greater than about 5 Torr, or greater. Alternatively or in addition, the pressure may be maintained at less than or about 10 Torr, less than or about 9 Torr, less than or about 8 Torr, less than or about 7 Torr, less than or about 6 Torr, or less.

Figure 4A:
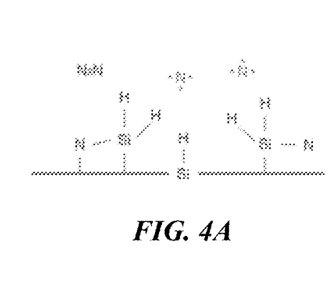
FIGS. 4A-4D illustrate an example of a growth mechanism in some deposition processes.
Figure 4B:
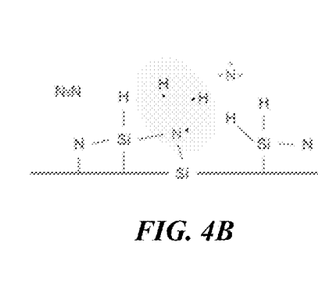
Figure 4C:
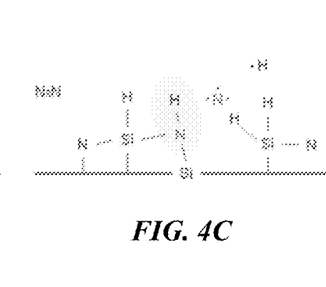
Figure 4D:
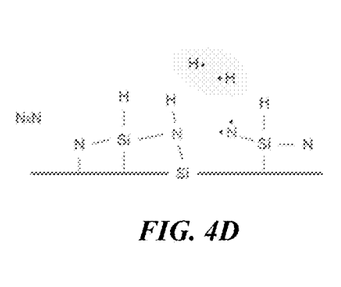

FIGS. 4A-4D illustrate an example of a growth mechanism in some deposition processes. In this example, low-temperature PECVD is used to deposit a silicon nitride film with silane and diatomic nitrogen precursors. As shown in FIG. 4A, no gas-phase reaction occurs between the silane and the diatomic nitrogen. Instead, $SiN_xH_y$ deposition starts from the chemisorption of $SiH_m$ radicals on the growth substrate. As shown in FIG. 4B, when landing on the reaction surface of the growth substrate, nitrogen radicals bond with silicon atoms and release hydrogen atoms. Due to the low energy of silicon-hydrogen bonds, this occurs at almost all silicon-hydrogen bond sites. However, as shown in FIG. 4C, as soon as the silicon-nitrogen bond is formed, released hydrogen radicals re-attach to unpaired electrons of nitrogen, which limits or prevents the formation of stretched silicon-nitrogen bonds that would afford increased stress within the film. A large number of nitrogen-hydrogen bonds and silicon-hydrogen bonds remain in the film, which also reduces density. As shown in FIG. 4D, nitrogen atoms build up vapor pressure that saturates any $SiH_m$ radicals arriving at the surface with silicon-nitrogen bonds. Because the silicon-nitrogen bonds have a low bond energy, the film eventually becomes nitrogen-rich as increased nitrogen bonding may occur at each site, which may further limit network formation.

Figure 4E:
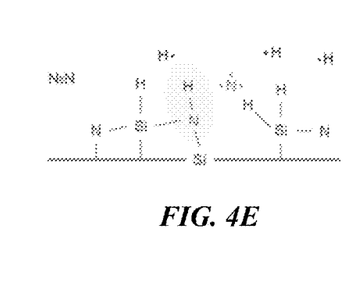
FIGS. 4E-4G illustrate an example of a growth mechanism according to some embodiments of the present technology.
Figure 4F:
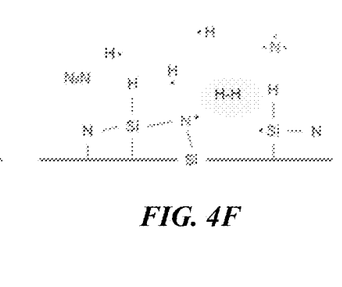
Figure 4G:
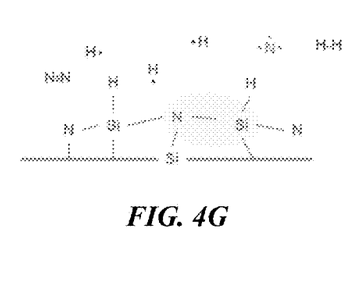

FIGS. 4E-4G illustrate an example of a growth mechanism according to some embodiments of the present technology that separately include nitrogen and hydrogen precursors. In this example, low-temperature PECVD is used to deposit a silicon nitride film by adding diatomic hydrogen to the silane and diatomic nitrogen precursors. The addition of the diatomic hydrogen creates a chemical annealing atmosphere that promotes the desorption of the nitrogen-hydrogen bond. As shown in FIG. 4E, when the diatomic hydrogen gas is added, the removal of the nitrogen-hydrogen bond is catalyzed by the existence of the free H radical. This is more favorable energetically than the silicon-hydrogen bond removal process. As shown in FIG. 4F, the unpaired electron or electrons on N promote crosslinking of the silicon-nitrogen bond, thereby increasing tensile stress. As shown in FIG. 4G, the film density is higher because it has fewer nitrogen-hydrogen voids. In this compact film, it is more difficult for nitrogen atoms to land on silicon-hydrogen sites, which causes the film to have more silicon-hydrogen bonds and to be silicon-rich.

FIGS. 5A-5F illustrate various deposition and film parameters as functions of the flow rate of diatomic hydrogen according to some embodiments of the present technology. In this example, a 27 MHz plasma is formed in a PECVD chamber at a temperature of 450° C. The flow rate of diatomic hydrogen may be greater than or about 100 sccm, greater than or about 1000 sccm, greater than or about 2000 sccm, greater than or about 3000 sccm, greater than or about 4000 sccm, or greater. However, as hydrogen flow continues to increase, as will be explained below, although nitrogen-hydrogen bonding may be limited, which may stabilize density, the increased hydrogen available may impact formation and may increase development of silicon-silicon bonding within the film, which may reduce film stress. Accordingly, in some embodiments the flow rate of diatomic hydrogen may be less than or about 5000 sccm, and may be maintained at less than or about 4000 sccm, less than or about 3000 sccm, less than or about 2000 sccm, or less, depending on the target internal stress within the film. The flow rate of diatomic hydrogen may be adjusted to achieve various deposition and film properties, as discussed in further detail below.

Figure 5A:
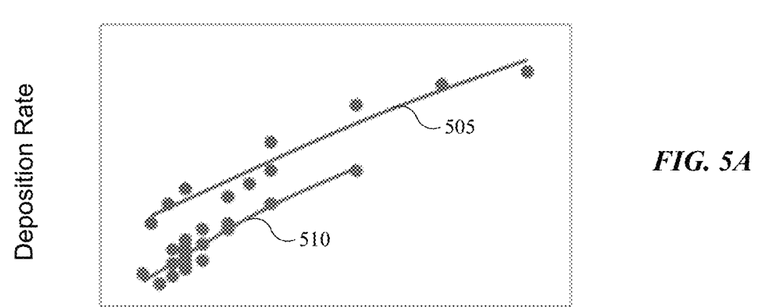
FIGS. 5A-5F illustrate various deposition and film parameters as functions of the flow rate of diatomic hydrogen according to some embodiments of the present technology.

As shown in FIG. 5A, the deposition rate of the film increases as a function of the flow rate of diatomic hydrogen. Further, for each flow rate, a first deposition rate 505 of a film deposited at a higher power of 1250 W is greater than a second deposition rate 510 of a film deposited at a lower power of 750 W. In this example, the deposition rate may be greater than or about 1200 Å/min, greater than or about 1300 Å/min, greater than or about 1400 Å/min, greater than or about 1500 Å/min, greater than or about 1600 Å/min, greater than or about 1700 Å/min, greater than or about 1800 Å/min, or greater.

Figure 5B:
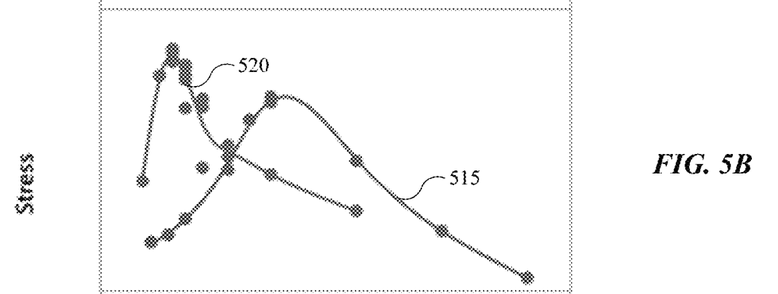

As shown in FIG. 5B, the stress of the film has a peak that varies according to the power. For example, a first stress 515 of a film deposited at the higher power of 1250 W has a peak at a greater flow rate than a second stress 520 of a film deposited at the lower power of 750 W. This is because the higher power generates more N radicals that are incorporated into the film during the deposition process. Further, the peak of the first stress 515 of the film deposited at the higher power may be lower than the peak of the second stress 520 of the film deposited at the lower power. In this example, the stress may be greater than or about 300 MPa, greater than or about 400 MPa, greater than or about 500 MPa, greater than or about 600 MPa, greater than or about 700 MPa, greater than or about 800 MPa, greater than or about 900 MPa, or greater.

Figure 5C:
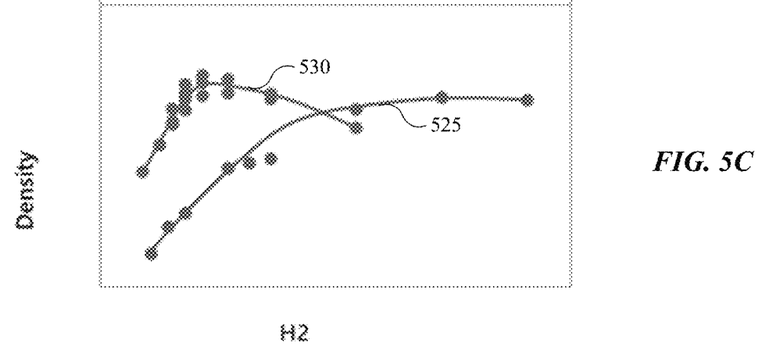

As shown in FIG. 5C, the density of the film has a profile that varies according to the power. For example, a first density 525 of a film deposited at the higher power of 1250 W increases as a function of the flow rate before leveling off. On the other hand, a second density 530 of a film deposited at the lower power of 750 W increases more quickly as a function of the flow rate, reaches a peak, and then gradually decreases. In this example, the density may be greater than or about 2.50 g/cm$^3$, greater than or about 2.55 g/cm$^3$, greater than or about 2.60 g/cm$^3$, greater than or about 2.65 g/cm$^3$, greater than or about 2.70 g/cm$^3$, greater than or about 2.75 g/cm$^3$, greater than or about 2.80 g/cm$^3$, greater than or about 2.85 g/cm$^3$, greater than or about 2.90 g/cm$^3$, or greater.

Figure 5D:
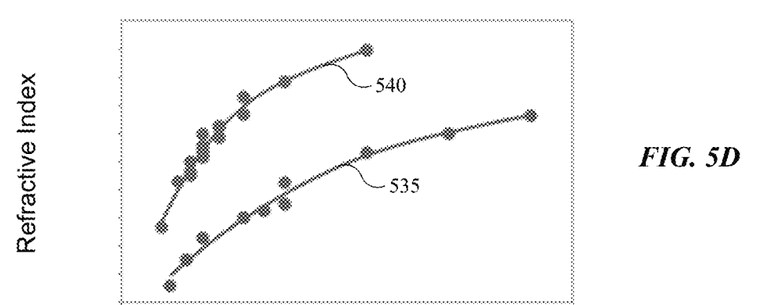

As shown in FIG. 5D, the refractive index of the film increases as a function of the flow rate of diatomic hydrogen. This indicates that the lower nitrogen-hydrogen bond density results in a more Si-rich film, which may cause the refractive index to increase. Further, a first refractive index 605 of a film deposited at a higher power of 1250 W is lower than a second refractive index 610 of a film deposited at a lower power of 750 W for each flow rate. In this example, the refractive index may be greater than or about 1.75, greater than or about 1.80, greater than or about 1.85, greater than or about 1.90, greater than or about 1.95, greater than or about 2.00, greater than or about 2.05, greater than or about 2.10, greater than or about 2.15, greater than or about 2.20, or greater.

Figure 5E:
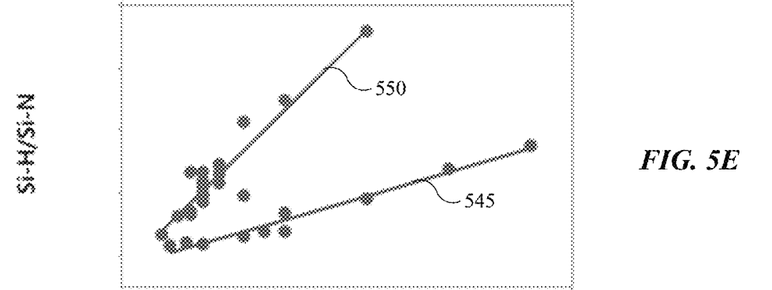

As shown in FIG. 5E, the ratio of the silicon-hydrogen bond density to the silicon-nitrogen bond density increases as a function of the flow rate of diatomic hydrogen. Further, for each flow rate, a first ratio 535 of the silicon-hydrogen bond density to the silicon-nitrogen bond density of a film deposited at a higher power of 1250 W is lower than a second ratio 540 of the silicon-hydrogen bond density to the silicon-nitrogen bond density of a film deposited at a lower power of 750 W. In this example, the ratio of the silicon-hydrogen bond density to the silicon-nitrogen bond density may be greater than or about 0.0%, greater than or about 0.4%, greater than or about 0.8%, greater than or about 1.2%, or greater.

Figure 5F:
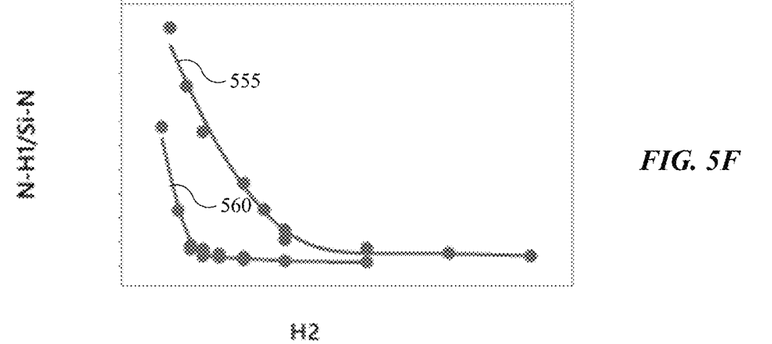

As shown in FIG. 5F, the ratio of the nitrogen-hydrogen bond density to the silicon-nitrogen bond density decreases as a function of the flow rate of diatomic hydrogen. Further, for each flow rate, a first ratio 555 of the nitrogen-hydrogen bond density to the silicon-nitrogen bond density of a film deposited at a higher power of 1250 W is lower than a second ratio 560 of the nitrogen-hydrogen bond density to the silicon-nitrogen bond density of a film deposited at a lower power of 750 W. In this example, the ratio of the nitrogen-hydrogen bond density to the silicon-nitrogen bond density may be lower than or about 25%, lower than or about 20%, lower than or about 15%, lower than or about 10%, lower than or about 5%, or lower.

As shown in FIGS. 5E and 5F, when small amounts of diatomic hydrogen are added, the nitrogen-hydrogen bond density decreases dramatically, while the silicon-hydrogen bond density increases moderately. This increases both the density and the stress of the film. The lower nitrogen-hydrogen bond density results in a more Si-rich film, as demonstrated by the corresponding increase in the refractive index shown in FIG. 5D. Further, as shown in FIGS. 5B and 5C, both the first density 525 and the second density 530 generally reach a saturation level above a certain flow rate level that corresponds to a sufficient decrease in the nitrogen-hydrogen bond density shown in FIG. 5F, while the first stress 515 and the second stress become more compressive above this flow rate level. In this region, the silicon-silicon bonds effectively release the tensile stress.

As discussed above, SiH$_4$ may be used as a precursor for silicon. The flow rate of silane may be greater than or about 10 sccm, greater than or about 100 sccm, greater than or about 200 sccm, greater than or about 300 sccm, greater than or about 400 sccm, or greater. Alternatively or in addition, the flow rate of silane may be less than or about 1000 sccm, less than or about 900 sccm, less than or about 800 sccm, less than or about 700 sccm, or less. Further, as discussed above, N$_2$ may be used as a precursor for nitrogen. The flow rate of N$_2$ may be greater than or about 1000 sccm, greater than or about 2000 sccm, greater than or about 3000 sccm, greater than or about 4000 sccm, greater than or about 5000 sccm, or greater. Alternatively or in addition, the flow rate of N$_2$ may be less than or about 10,000 sccm, less than or about 9000 sccm, less than or about 8000 sccm, less than or about 7000 sccm, or less.

Some of the methods discussed above may perform the deposition process without using $NH_3$ as a precursor, and may expressly not include ammonia. In other examples, $NH_3$ may be used as a precursor for nitrogen. The flow rate of $NH_3$ may be greater than or about 1000 sccm, greater than or about 2000 sccm, greater than or about 3000 sccm, greater than or about 4000 sccm, greater than or about 5000 sccm, or greater. Alternatively or in addition, the flow rate of $NH_3$ may be less than or about 10,000 sccm, less than or about 9000 sccm, less than or about 8000 sccm, less than or about 7000 sccm, or less.

Further, as discussed above, carrier gases such as argon and/or helium may be used to deliver the precursors. The flow rate of argon may be greater than or about 0 sccm, greater than or about 1000 sccm, greater than or about 2000 sccm, greater than or about 3000 sccm, greater than or about 4000 sccm, or greater. Alternatively or in addition, the flow rate of argon may be less than or about 10,000 sccm, less than or about 9000 sccm, less than or about 8000 sccm, less than or about 7000 sccm, or less. Similarly, the flow rate of helium may be greater than or about 0 sccm, greater than or about 1000 sccm, greater than or about 2000 sccm, greater than or about 3000 sccm, greater than or about 4000 sccm, or greater. Alternatively or in addition, the flow rate of helium may be less than or about 10,000 sccm, less than or about 9000 sccm, less than or about 8000 sccm, less than or about 7000 sccm, or less.

The methods described above may also be used to reduce the amount of hydrogen that is formed in the silicon nitride film. Conventional low-temperature PECVD processes typically produce films having more than 10% hydrogen incorporation, which may reduce the film quality due to subsequent void formation. In contrast, the methods described above may include diatomic hydrogen with the silicon-containing precursor and the nitrogen-containing precursor, which may counterintuitively reduce the amount of hydrogen in the film to lower than or about 10%, lower than or about 9%, lower than or about 8%, lower than or about 7%, or lower. This may improve the film quality and facilitate subsequent removal with nitride-specific etchants.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a material" includes a plurality of such materials, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method comprising:
   flowing a plurality of precursors into a processing region of a semiconductor processing chamber, wherein the plurality of precursors comprises a silicon-containing precursor, a nitrogen-containing precursor, and diatomic hydrogen, wherein a substrate is housed within the processing region of the semiconductor processing chamber,
   forming a plasma of the silicon-containing precursor, the nitrogen-containing precursor, and the diatomic hydrogen, wherein the plasma is formed at a frequency above 15 MHz; and
   depositing a silicon nitride material on the substrate.

2. The method of claim 1, wherein the silicon nitride material is characterized by a density above or about 2.85 $g/cm^3$.

3. The method of claim 1, wherein the silicon nitride material is characterized by a stress above or about 400 MPa.

4. The method of claim 1, wherein the silicon nitride material is characterized by a refractive index above or about 1.75.

5. The method of claim 1, wherein the silicon nitride material comprises less than or about 10% of hydrogen.

6. The method of claim 1, wherein greater than or about 100 sccm of the diatomic hydrogen is flowed into the processing region of the semiconductor processing chamber.

7. The method of claim 6, wherein less than or about 5000 sccm of the diatomic hydrogen is flowed into the processing region of the semiconductor processing chamber.

8. The method of claim 1, wherein the plasma is formed at a temperature below or about 550° C.

9. The method of claim 1, wherein the frequency is above or about 27 MHz.

10. A method comprising:
    flowing a plurality of precursors into a processing region of a semiconductor processing chamber, wherein the plurality of precursors comprises a silicon-containing precursor, a nitrogen-containing precursor, and diatomic hydrogen, wherein a substrate is housed within the processing region of the semiconductor processing chamber;
    forming a plasma of the silicon-containing precursor, the nitrogen-containing precursor, and the diatomic hydrogen, wherein the plasma is free of any material having a nitrogen-hydrogen bond; and
    depositing a silicon nitride material on the substrate, wherein:
    the silicon nitride material is characterized by a density above or about 2.85 $g/cm^3$, and the silicon nitride material is characterized by a stress above or about 400 MPa.

11. The method of claim 10, wherein the silicon nitride material is characterized by a refractive index above or about 1.75.

12. The method of claim 10, wherein the silicon nitride material comprises less than or about 10% of hydrogen.

13. The method of claim 10, wherein greater than or about 100 sccm of the diatomic hydrogen is flowed into the processing region of the semiconductor processing chamber.

14. The method of claim 13, wherein less than or about 5000 sccm of the diatomic hydrogen is flowed into the processing region of the semiconductor processing chamber.

15. The method of claim 10, wherein the plasma is formed at a temperature below or about 550° C.

16. The method of claim 10, wherein the plasma is formed at a frequency above 15 MHz.

17. The method of claim 16, wherein the frequency is above or about 27 MHz.

18. A method comprising:
   flowing a plurality of precursors into a processing region of a semiconductor processing chamber, wherein the plurality of precursors comprises a silicon-containing precursor, a nitrogen-containing precursor, and diatomic hydrogen, wherein a substrate is housed within the processing region of the semiconductor processing chamber;
   forming a plasma of the silicon-containing precursor, the nitrogen-containing precursor, and the diatomic hydrogen; and
   depositing a silicon nitride material on the substrate, wherein:
   greater than or about 100 sccm of the diatomic hydrogen is flowed into the processing region of the semiconductor processing chamber, and
   less than or about 5000 sccm of the diatomic hydrogen is flowed into the processing region of the semiconductor processing chamber.

19. The method of claim 18, wherein the silicon nitride material is characterized by a density above or about 2.85 g/cm$^3$.

20. The method of claim 18, wherein the silicon nitride material is characterized by a stress above or about 400 MPa.

* * * * *